United States Patent
Nakazawa et al.

(10) Patent No.: US 6,319,763 B1
(45) Date of Patent: Nov. 20, 2001

(54) MANUFACTURING METHOD FOR SEMICONDUCTOR DEVICE

(75) Inventors: Makoto Nakazawa; Toshio Nagata, both of Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/497,500

(22) Filed: Feb. 4, 2000

(30) Foreign Application Priority Data

Apr. 21, 1999 (JP) .................................................. 11-113643

(51) Int. Cl.[7] ........................ H01L 21/8242; H01L 21/20
(52) U.S. Cl. ........................ 438/239; 438/253; 438/393; 438/396
(58) Field of Search .................................... 438/239, 242, 438/658, 253, 762, 255, 393, 396

(56) References Cited

U.S. PATENT DOCUMENTS

| | | | |
|---|---|---|---|
| 4,621,277 | * | 11/1986 | Ito et al. .................................. 357/54 |
| 4,623,912 | * | 11/1986 | Chang et al. ............................ 357/54 |
| 5,250,456 | * | 10/1993 | Bryant .................................... 438/253 |
| 5,290,729 | * | 3/1994 | Hayashide et al. ..................... 438/255 |
| 5,397,748 | * | 3/1995 | Watanabe et al. ...................... 438/762 |
| 5,478,765 | * | 12/1995 | Kwong et al. .......................... 437/40 |
| 5,629,043 | * | 5/1997 | Inaba et al. ............................. 427/79 |

* cited by examiner

Primary Examiner—Matthew Smith
Assistant Examiner—Lex H. Malsawma
(74) Attorney, Agent, or Firm—Volentine Francos, PLLC

(57) ABSTRACT

A lower capacitor electrode is formed on an interlayer dielectric, and then a resultant specimen is subjected to reduction and thermal nitriding in an ammonia gas atmosphere in a deposition chamber wherein pressure has been reduced to a range from 533 Pa to 1333 Pa. A silicon nitride film is then formed on the lower electrode and the interlayer dielectric. A time for carrying out the reduction and thermal nitriding is longer than a film thickness saturation time of the silicon nitride film formed on the interlayer dielectric.

12 Claims, 11 Drawing Sheets

| STEP | TIME | MV | SV | MBP | DP | MFC2 | MFC1 | PRESSURE |
|---|---|---|---|---|---|---|---|---|
| 1 | 0:00:20 | OPEN | CLOSE | ON | ON | 0SLM | 0sccm | $10^{-2}$Pa ORDER |
| 2 | 0:00:20 | OPEN | CLOSE | ON | ON | 2SLM | 0sccm | $10^{-2}$Pa ORDER |
| 3 | 0:00:30 | OPEN | CLOSE | ON | ON | 2SLM | 50sccm | 160Pa |
| 4 | 0:04:30 | OPEN | CLOSE | ON | ON | 2SLM | 50sccm | 160Pa |
| 5(ISN) | 0:30:00 | OPEN | CLOSE | ON | ON | 2SLM | 50sccm | 533Pa |

…

MANUFACTURING METHOD FOR SEMICONDUCTOR DEVICE

BACKGROUND OF THE INVENTION

1. Field of the Invention

The present invention relates to a manufacturing method for a semiconductor device and, more particularly, to a manufacturing method for a semiconductor device provided with a capacitor on an interlayer dielectric, the capacitor comprising a silicon nitride film serving as a capacitor dielectric film.

2. Description of Related Art

In recent years, semiconductor memory devices employ silicon nitride films as capacitor dielectric films in order to increase capacitance of capacitors. In order to take full advantage of using silicon nitride films, a process for forming a silicon nitride film is sometimes employed, wherein a lower electrode composed of a silicon type material, typically a polycrystalline silicon material, is first formed on an interlayer dielectric, then this specimen is placed in a deposition chamber to be subjected to pretreatment in which the specimen is subjected to heat in an ammonia gas atmosphere in the deposition chamber, the pressure of which has been reduced (this pretreatment will be hereinafter referred to as "in-situ surface nitriding (ISN)"). Then, an ammonia gas and a gas for forming a silicon type thin film are introduced into the deposition chamber to form a silicon nitride film on the lower electrode and the interlayer dielectric. The reduced pressure CVD method is employed as a typical method for forming the silicon nitride film after the ISN treatment is finished.

A native oxide produced on the lower electrode is reduced and thermally nitrided during the ISN treatment. Thus, a silicon nitride film by the ISN is formed on a surface of the lower electrode. This provides an advantage in that a chance for an oxide film to be produced between the lower electrode and the silicon nitride film produced by the CVD method is minimized, permitting an advantage of using the silicon nitride film as a capacitor dielectric film to be easily obtained.

Generally, in the process mentioned above, a heat treatment known as "healing oxidation" is carried out on the silicon nitride film, which has been formed, so as primarily to repair defects or the like of the film.

However, according to experiments performed by the inventors of the present application have revealed that a portion of the silicon nitride film that is formed on the interlayer dielectric tends to be thinner than another portion that is formed on the lower electrode in the foregoing process including the ISN treatment. It has also been found that the thickness is considerably influenced by the degree of vacuum in a deposition chamber in the ISN treatment.

SUMMARY OF THE INVENTION

An object of the present invention is to prevent abnormal oxidization of an electrode, wiring, etc. under an interlayer dielectric attributable to heat treatment or the like after silicon nitride film is formed as a capacitor dielectric film.

To this end, according to the present invention, there is provided a manufacturing method for a semiconductor device that has a capacitor electrode comprising a silicon nitride film as a capacitor dielectric film, including the steps of forming a lower electrode on an interlayer dielectric, and carrying out reduction and thermal nitriding on a specimen, on which the foregoing lower electrode has been formed, in an ammonia gas atmosphere in a deposition chamber wherein pressure has been reduced to a range from 533 Pa (4 torr; 1 torr is about 133.3 Pa. The same applies hereinafter.) to 1333 Pa. The range of the pressure of 533 Pa or more includes any value in a range of 483 Pa or more and below 533 Pa, taking a margin of 50 Pa into account.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings.

DESCRIPTION OF THE PREFERRED EMBODIMENTS

Figure 1:
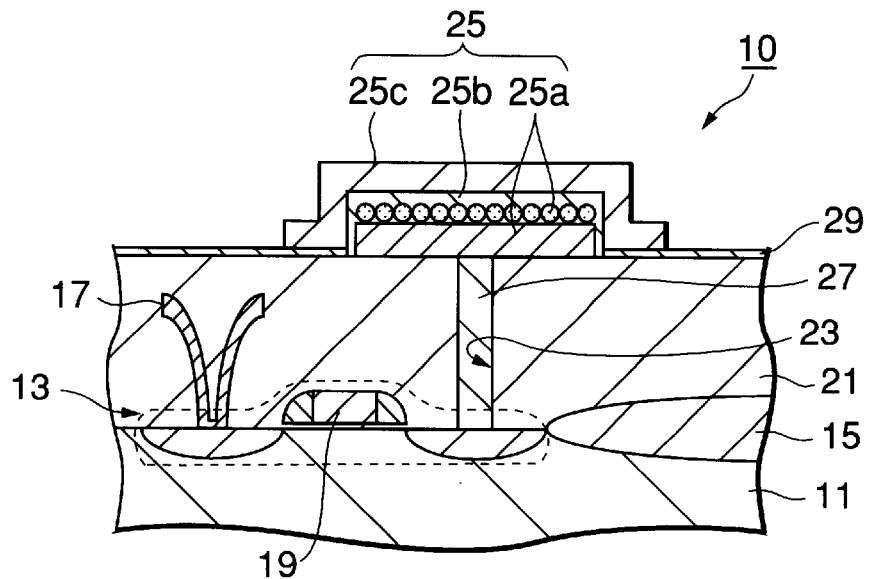
FIG. 1 shows an example of a structure of a semiconductor device.

Preferred embodiments of a manufacturing method for a semiconductor device in accordance with the present invention will be described in conjunction with the accompanying drawings. The drawings used for the description merely provide schematic illustrations to help understanding the present invention. In the drawings, like reference numerals will be assigned to like components, and descriptions thereof may not be repeated.

FIG. 1 is a sectional view showing a semiconductor memory device 10 preferably manufactured by the manufacturing method in accordance with the present invention. To be more specific, FIG. 1 is a sectional view focused on a single memory cell of the semiconductor memory device 10.

The semiconductor memory device 10 is equipped with a silicon substrate 11 serving as a semiconductor substrate, a switching device 13 and an insulating film 15 for isolating devices provided on the substrate 11, a bit line 17 and a word line 19, which partly serves as a gate electrode, that are connected to the switching device 13, an interlayer dielectric 21 in which the foregoing components 13 through 19 are buried, a contact hole 23 provided in the interlayer dielectric 21, a capacitor 25 provided on the interlayer dielectric 21, and a wire 27 in the contact hole that connects the components 13 and 25. Reference numeral 29 in FIG. 1 denotes a portion of a silicon nitride film formed on the interlayer dielectric at the same time when the silicon nitride film serving as a capacitor dielectric film is formed.

The capacitor 25 is constituted by a lower electrode 25a, a capacitor dielectric film 25b composed of a silicon nitride film, and an upper electrode 25c.

In the illustrated example, a surface of the lower electrode 25a is formed to be a roughened surface (schematically shown by circles in the drawing) in order to maximize a capacitance of the capacitor. Obviously, the roughened surface is just an example, and dispensable. The lower electrode 25a itself is formed of a silicon type material, typically a doped polycrystalline silicon.

Figure 2:
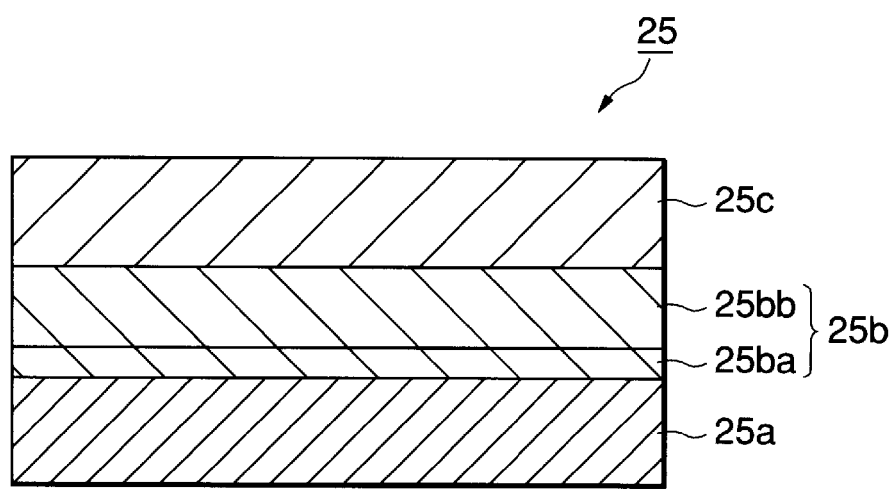
FIG. 2 shows an example of a structure of a capacitor.

A silicon nitride film serving as the capacitor dielectric film 25b is preferably manufactured by the method in accordance with the present invention which will be discussed hereinafter. To be more specific, as shown in FIG. 2, the capacitor dielectric film 25b is preferably formed to include a first silicon nitride film 25ba formed by the ISN treatment and a second silicon nitride film 25bb formed by, for example, the reduced pressure CVD method in this order from the lower electrode 25a. As previously described, the first and second silicon nitride films 25ba and 25bb are formed as the silicon nitride film 29 also on the interlayer dielectric 21.

Figure 4A:
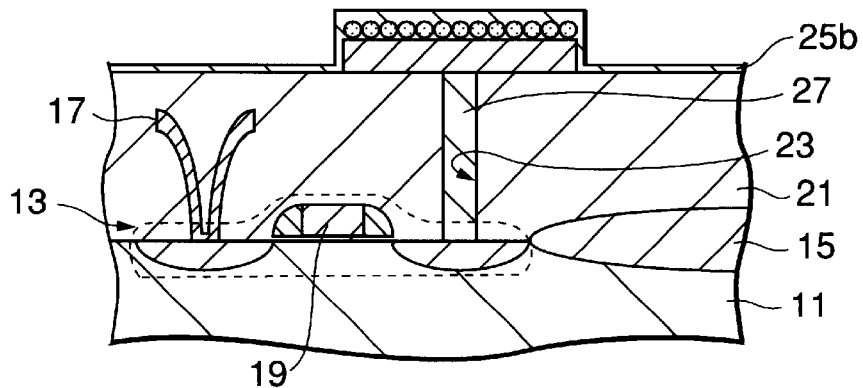
FIGS. 4(A)–4(C) depict a process continuing from that of FIG. 3(C) of the manufacturing method in accordance with the embodiment.
Figure 5:
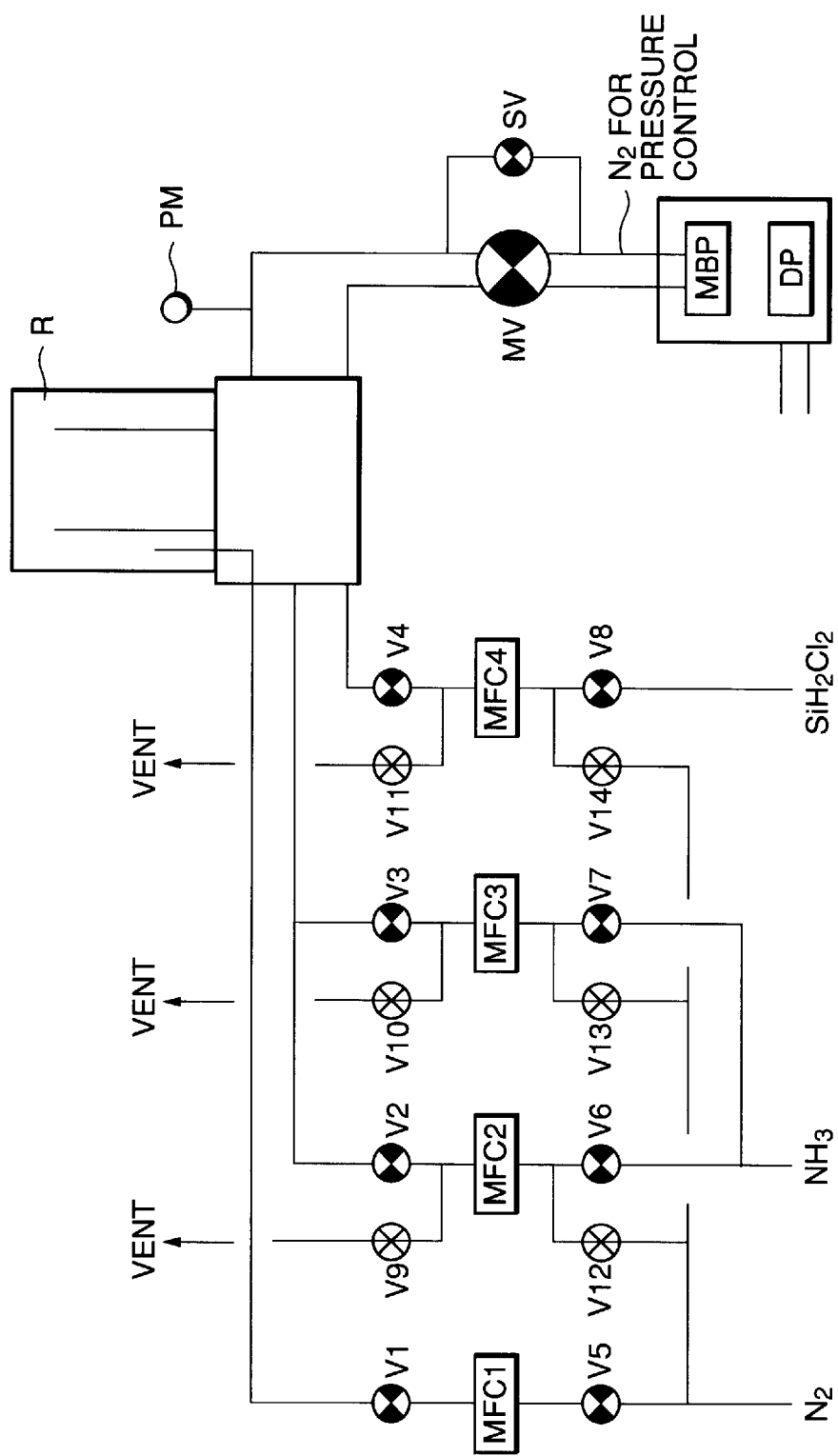
FIG. 5 shows an example of a reduced pressure CVD apparatus.
Figures 6, 7:
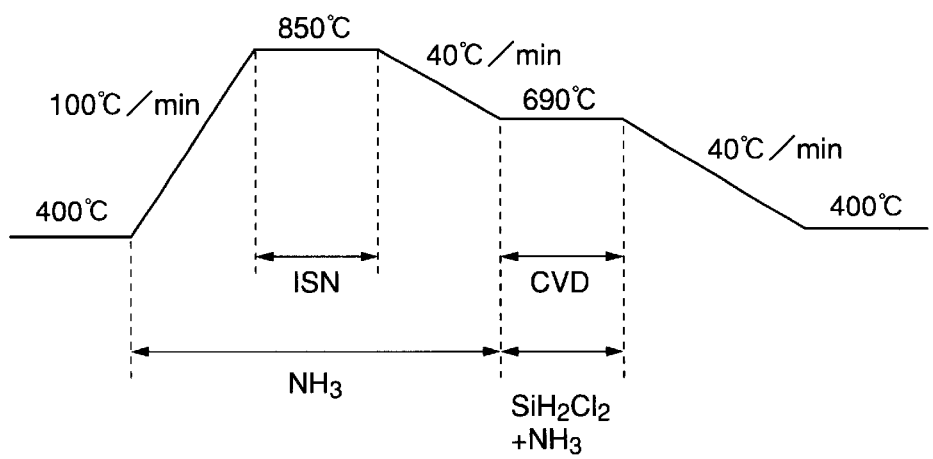
FIG. 6 is a schematic representation illustrating an example of a parameter of the embodiment.
FIG. 7 is a schematic representation illustrating an example of a temperature profile of the embodiment.

The semiconductor device 10 shown in FIG. 1 can be manufactured according to a procedure of the manufacturing method in accordance with the present invention described below. FIG. 3 and FIG. 4 show the steps of the procedure to describe the procedure. FIG. 5 is a block diagram illustrating an example of a configuration of an apparatus for depositing a capacitor dielectric film, namely, a reduced pressure CVD apparatus or a hot wall type CVD apparatus in this case. FIG. 6 shows modes of carrying out and depositing conditions of embodiments and comparative examples which will be discussed hereinafter. To be more specific, FIG. 6 mainly shows an operating procedure and setting conditions of a main valve MV, a sub valve SV, a mechanical booster pump MBP, a diffusion pump DP, a flow rate controllers MFC 1 and 2 in the deposition apparatus shown in FIG. 5, and the degree of vacuum (a pressure at the position of a pressure gauge PM) of a deposition chamber R. FIG. 7 shows an example of depositing conditions when the present invention is applied, especially of a temperature profile of a specimen observed during a deposition process.

First, an FET serving as a switching device and the insulating film 15 for isolating devices are formed on the semiconductor substrate 11 by a known method. Then, the bit line 17 and the word line 19 are formed by a known method.

Next, the switching devices 13, etc. are covered with the interlayer dielectric 21. As the interlayer dielectric 21, a BPSG film for example, is employed. Then, a contact hole 23 for exposing one source-drain region of the switching device 13 is formed in a part of the interlayer dielectric 21 by a known method.

Figure 3A:
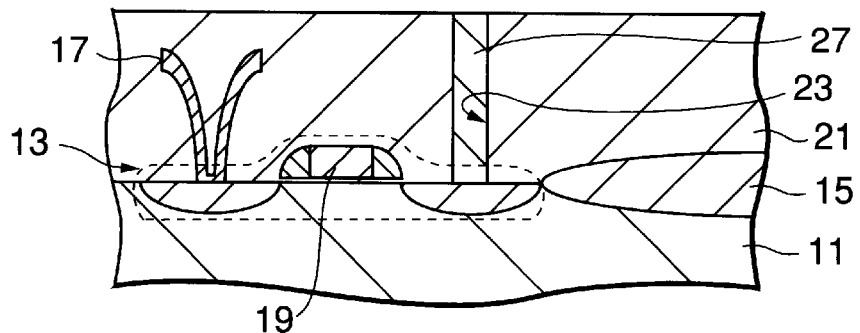
FIGS. 3(A)–3(C) depict a process of a manufacturing method in accordance with an embodiment.

Subsequently, the wire 27 is formed in the contact hole 23 by a known method as shown in FIG. 3A.

Figure 3B:
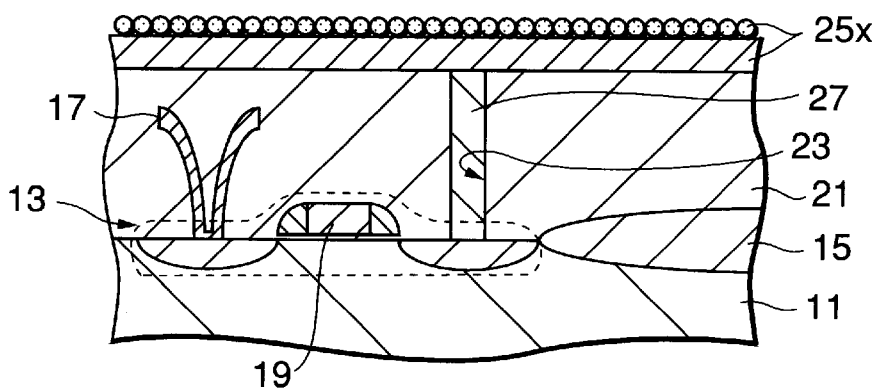
Figure 3C:
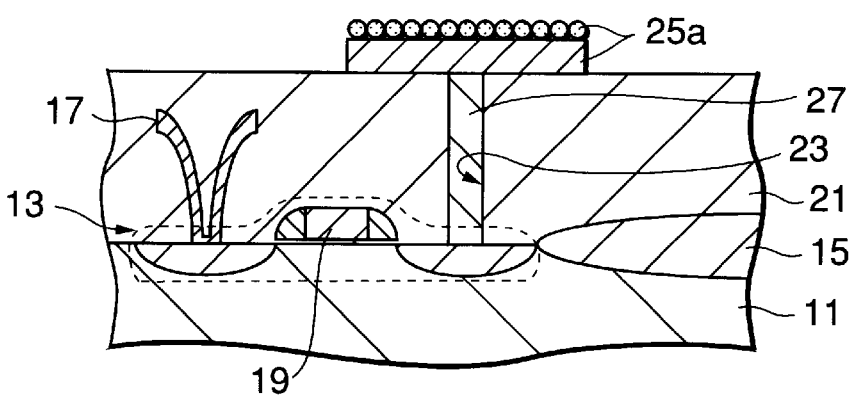

In the following step, a doped polycrystalline silicon film (including a roughened surface polycrystalline silicon) 25x is formed as a lower electrode forming thin film on the interlayer dielectric 21 as shown in FIG. 3B. The formed polycrystalline silicon film is patterned according to a configuration of the lower electrode so as to produce the lower electrode 25a as shown in FIG. 3C.

Furthermore, the foregoing specimen is placed in a deposition chamber (not shown). With the deposition chamber filled with an ammonia gas and in a reduced pressure state, a temperature in the deposition chamber or a temperature of the specimen is gradually raised. As shown in FIG. 6, the temperature in the deposition chamber or the temperature of the specimen is gradually increased while gradually increasing the degree of vacuum in the deposition chamber from an order of $10^{-2}$ Pa toward 533 Pa, although this is not the only one method. As shown in FIG. 7, for instance, the temperature is raised in 100° C./min. increments. When the temperature in the deposition chamber reaches a sufficiently high level for thermal nitriding (in a range of 840 to 860 degrees Celsius, e.g. about 850 degrees Celsius, although the temperature is not limited thereto), the degree of vacuum in the deposition chamber is set at a suitable value of 533 Pa or more (e.g. 533 Pa). This condition is maintained for a predetermined period of time to perform the ISN treatment. Preferably, the ISN treatment time is longer than a time that has been experimentally determined in advance. This will be described in more detail in conjunction with a third embodiment.

The ISN treatment causes the lower electrode 25a to be reduced and thermally nitrided, so that even if a native oxide is produced on a surface of the lower electrode 25a, the native oxide will turn into the silicon nitride film 25ba (see FIG. 2) attributable to the ISN treatment.

Then, the temperature in the deposition chamber is lowered to a level suited for CVD, to a range of 650 to 700 degrees Celsius, e.g. to about 690 degrees Celsius, although it is not limited to this temperature. Under this condition, an ammonia gas and $SiH_2Cl_2$ are supplied into the deposition chamber. A flow ratio of the ammonia gas to $SiH_2Cl_2$ is set to 1:1 to 1:6, e.g. 1:5, taking dichlorosilane ($SiH_2Cl_2$) as 1, although the ratio is not limited thereto. This condition is maintained for a predetermined period of time. The pressure in the deposition chamber at this time is set to a degree of vacuum ideally suited for deposition, ranging from 13.3 to 27 Pa, e.g. 20 Pa, although it is not limited thereto. In this treatment, the silicon nitride film 25bb (see FIG. 2) from the reduced pressure CVD is formed on the silicon nitride film 25ba (see FIG. 2) from the ISN treatment. This completes the formation of the silicon nitride film 25b as the capacitor dielectric film (see FIG. 4A).

After completion of the formation of the silicon nitride film, the deposition chamber is gradually cooled, and the specimen is taken out of the deposition chamber.

Next, to repair film defects of the silicon nitride film 25b, the specimen is subjected to healing oxidization. The healing oxidization is carried out at 850 degrees Celsius for 30 minutes in a wet oxygen atmosphere, although the condition is not limited thereto.

Figure 4B:
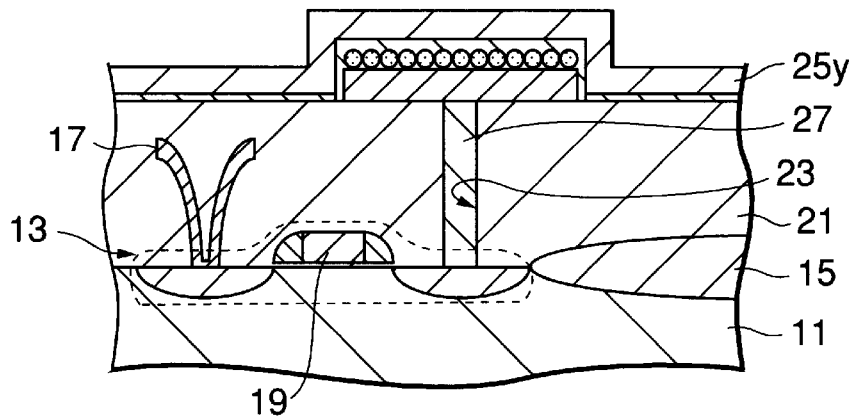
Figure 4C:
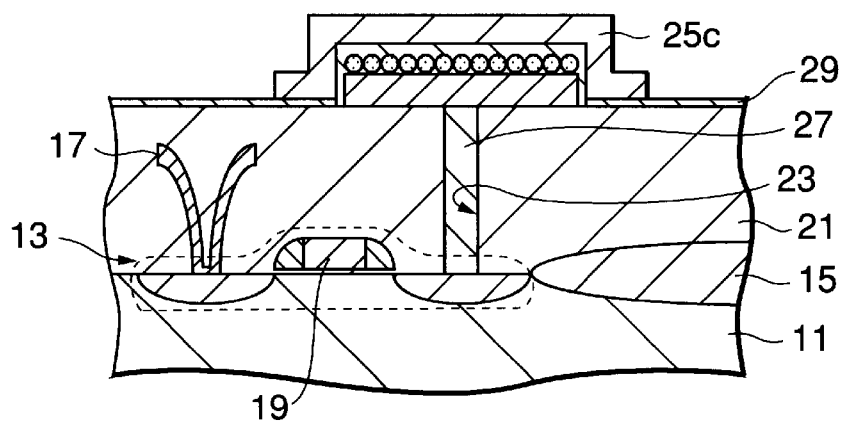

In the next step, as a thin film for forming the upper electrode, a doped polycrystalline silicon film 25y, for example, is formed on the specimen, which has been subjected to the healing oxidization, as shown in FIG. 4B, then the film is patterned to a configuration of the upper electrode. Thus the upper electrode 25c is formed as shown in FIG. 4C.

When all the above steps have been implemented, a major section of the semiconductor memory device in which each memory cell is constructed by a capacitor and a transistor is completed.

The present invention will now be described in more detail in conjunction with embodiments.

1. First Embodiment (Experiments on the degree of vacuum in a deposition chamber for the ISN treatment)

First, the degree of vacuum in the deposition chamber for ISN treatment is set to three different levels, namely, 160 Pa, 533 Pa, and 800 Pa, the remaining conditions such as ISN treatment time, treatment conditions, CVD deposition time, and depositing conditions being all the same. Semiconductor devices are fabricated at the three different degrees of vacuum according to the procedure described above. More specifically, the pressure in the deposition chamber at the time of the ISN treatment in step 5 of the depositing conditions of FIG. 6 is set to 160 Pa, 533 Pa, and 800 Pa, respectively, so as to fabricate the semiconductor devices under three different levels of vacuum.

Then, the film thicknesses of the silicon nitride films 25b formed on the lower electrodes 25a of the respective specimens produced under three different levels of vacuum are measured. The thicknesses of oxide films produced on the surfaces of the silicon nitride films 25b by healing oxidization are also measured.

Figure 8:
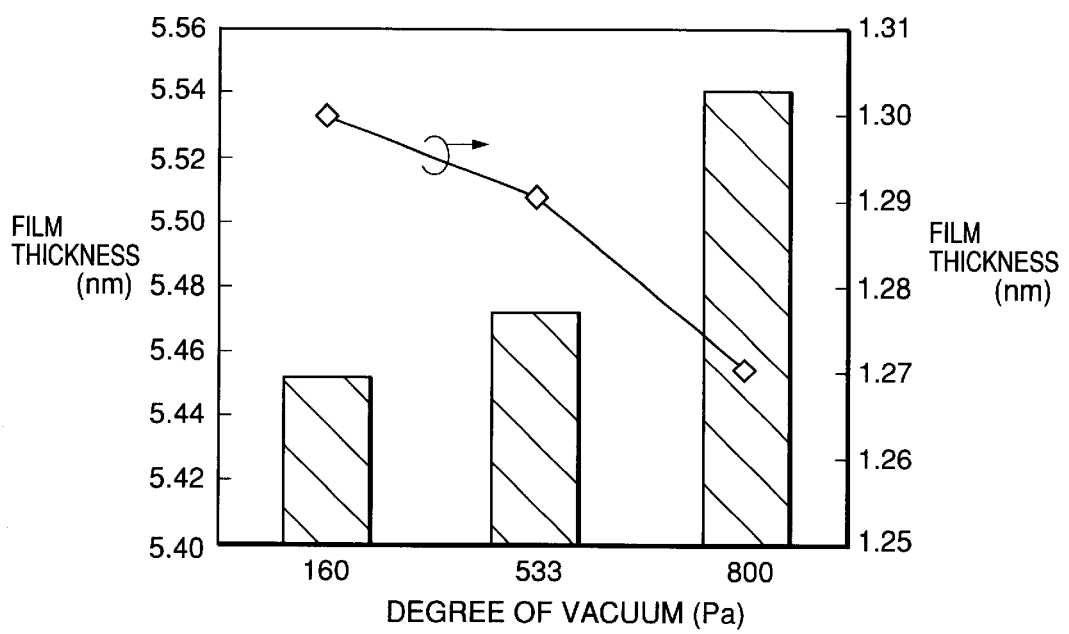
FIG. 8 is a schematic representation showing experiment results.

The measurement results are shown in FIG. 8. In FIG. 8, the axis of abscissa indicates the degree of vacuum in the deposition chamber during the ISN treatment, the left axis of ordinates indicates the film thickness of the silicon nitride film 25b formed on the lower electrode 25a, and the right axis of ordinates indicates the film thickness of an oxide film or a healing oxide film produced on the surface of the silicon nitride film 25b during the healing oxidization. The bar graphs provide data regarding the film thicknesses of the silicon nitride films, and the line charts provide data regarding the film thicknesses of the healing oxide films.

As can be seen from FIG. 8, when the pressure in the deposition chamber for the ISN treatment is set at 160 Pa, 533 Pa, and 800 Pa, respectively, the silicon nitride films of approximately the same film thicknesses, namely, 5.45 nm, 5.47 nm, and 5.54 nm, are formed on the lower electrodes 25a. It is also understood that the healing oxide films at the different levels of vacuum are all thin, sharing a similar film thickness, namely, 1.30 nm, 1.28 nm, and 1.27 nm. Hence, it can be concluded within the scope of the experiments that the film thickness and resistance to oxidization of the silicon nitride film formed on the lower electrode is not influenced by the degree of vacuum in the deposition chamber at the time of the ISN treatment.

Furthermore, regarding the specimens fabricated at the three vacuum levels, the film thickness of the silicon nitride film 25b formed on the interlayer dielectric 21, and the film thickness of an oxide film produced on the surface of the silicon nitride film 25b due to the healing oxidization are measured.

Figure 9:
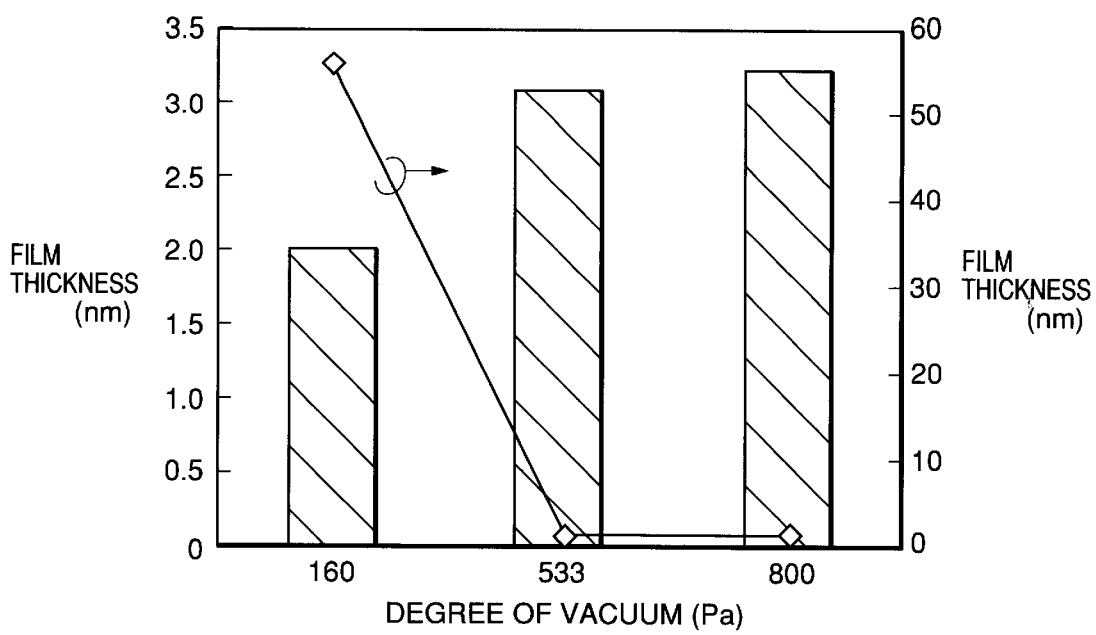
FIG. 9 is a schematic representation showing experiment results.

The measurement results are shown in FIG. 9. In FIG. 9, the axis of abscissa indicates the degree of vacuum in the deposition chamber during the ISN treatment, the left axis of ordinates indicates the film thickness of the silicon nitride film 25b formed on the interlayer dielectric 21, and the right axis of ordinates indicates the film thickness of an oxide film or a healing oxide film produced on the surface of the silicon nitride film 25b during the healing oxidization. The bar graphs provide data regarding the film thicknesses of the silicon nitride films, and the line charts provide data regarding the film thicknesses of the healing oxide films.

As can be seen from FIG. 9, when the pressure in the deposition chamber during the ISN treatment is set to 160 Pa, 533 Pa, and 800 Pa, respectively, silicon nitride films having thicknesses of 2.0 nm, 3.1 nm, and 3.2 nm, respectively, are formed on the lower electrode 25a. This means that, at the degrees of vacuum of 533 Pa or more in the deposition chamber, the film thickness is approximately the same (3.1 to 3.2 nm), and silicon nitride films that are 1.5 times as thick as the silicon nitride film produced at 160 Pa. The thicknesses of the healing oxide films at the different levels of vacuum are 56 nm, 1.35 nm, and 1.57 nm. This means that, at levels of 533 Pa or more in the deposition chamber, the thicknesses of the healing oxide films are approximately the same (1.3 to 1.5 nm), and are only about 1/56 of the thickness of the healing oxide film produced at 160 Pa.

Figure 10:
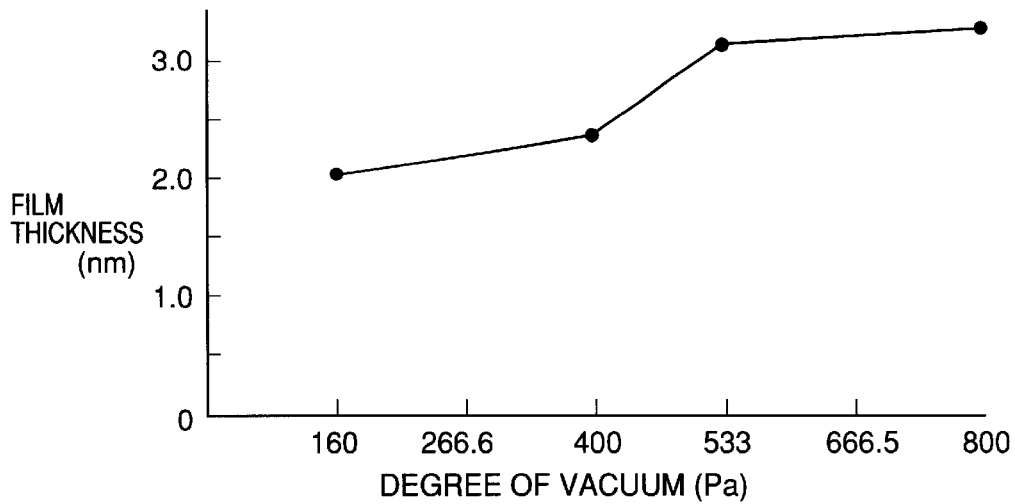
FIG. 10 is a schematic representation showing experiment results.

In another experiment carried out with the degree of vacuum in the deposition chamber set at 400 Pa, the film thickness of the silicon nitride film formed on the interlayer dielectric was approximately 2.3 nm. This thickness and the foregoing film thicknesses, namely, 2.0 nm, 3.1 nm, and 3.2 nm, are plotted in relation to the degree of vacuum in the deposition chamber during the ISN treatment. The plotting result reveals a relationship as shown in FIG. 10.

Figure 11:
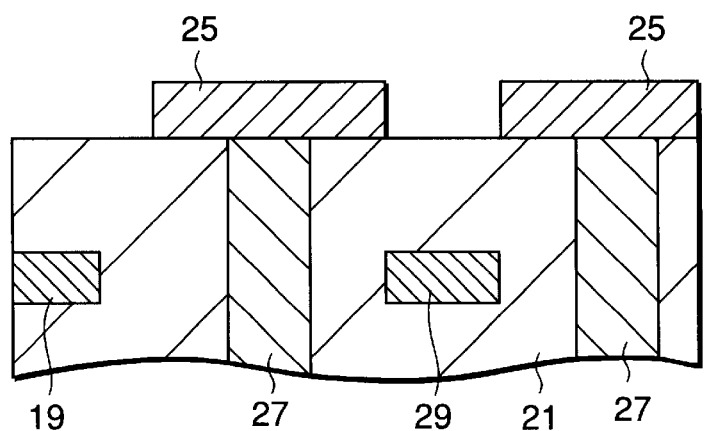
FIG. 11 is a schematic representation showing a structure of a semiconductor device in accordance with an embodiment.
Figure 12:
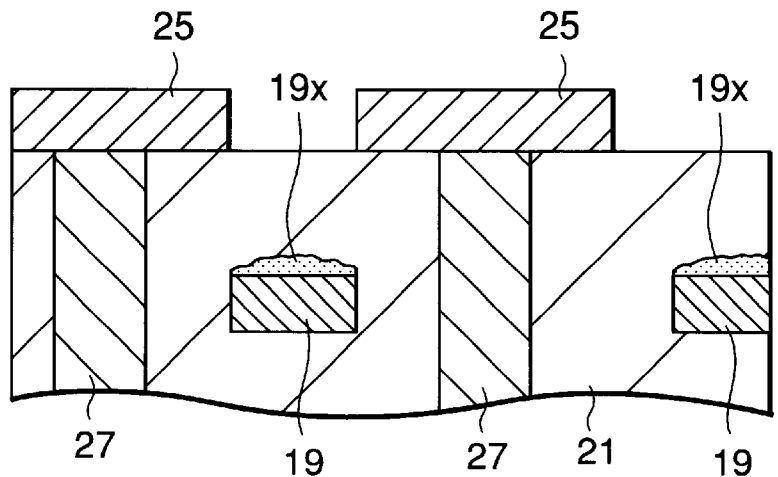
FIG. 12 is another schematic representation showing a structure of a semiconductor device in accordance with an embodiment.

FIG. 11 and FIG. 12 are schematic diagrams of scanning electron microscope photos showing a wiring portion of the interlayer dielectric of each device fabricated at a vacuum degree in the deposition chamber during the ISN treatment set at 533 Pa and each device fabricated at 160 Pa. Both photos are focused on a neighborhood of the word line 19. From the photo FIG. 12, it has been found that, when the degree of vacuum is set at 160 Pa, the word line or the polycrystalline silicon wire in the interlayer dielectric is also oxidized, and an abnormal oxide film 19x is produced.

Based on the experiment results described above, it can be concluded that, by setting the vacuum degree in the deposition chamber during the ISN treatment at 533 Pa or more, a silicon nitride film that is thicker and features higher resistance to oxidization than the one formed at a vacuum degree below 533 Pa can be formed.

2. Second Embodiment (Experiment on electrical characteristics such as a capacitance of a capacitor)

Under the condition where the degree of vacuum in the deposition chamber during the ISN treatment is set to 533 Pa, devices having capacitor dielectric films of four different film thicknesses, namely, 5.0 nm, 5.5 nm, 6.0 nm, and 7.0 nm, according to the manufacturing procedure described in conjunction with the foregoing embodiment. In addition, a device having a capacitor dielectric of a 7.0-nm film thickness is manufactured at a degree of vacuum of 160 Pa in the deposition chamber during the ISN treatment. The capacitances of the capacitors of these five specimen devices are measured. The measurement results are shown in FIG. 13.

Figure 13:
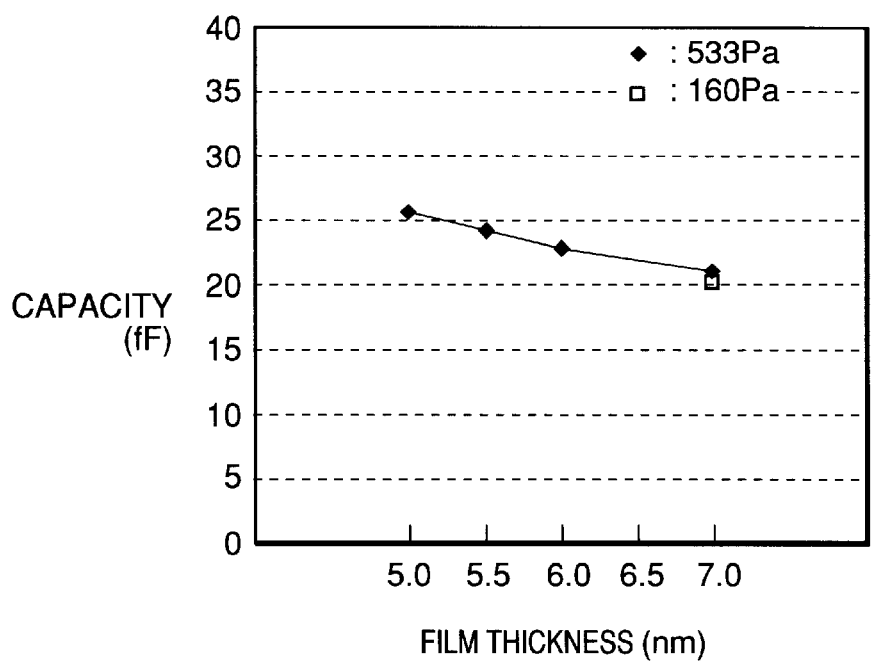
FIG. 13 is a schematic representation illustrating experiment results.

As can be seen from FIG. 13, the four specimen devices produced at 533 Pa provide appropriate capacitances of capacitors according to the individual film thicknesses. The capacitances of the capacitors of two devices manufactured with the degree of vacuum in the deposition chamber set at 160 Pa and 533 Pa for the ISN treatment are almost the same, namely, about 20 fF. These measurement results indicate that increasing the degree of vacuum in the deposition chamber during the ISN treatment does not affect the capacitances of capacitors. Furthermore, as mentioned previously, increasing the pressure improves resistance to oxidization. Hence, the capacitor dielectric film or the silicon nitride film can be made thinner, enabling the capacitance of the capacitor to be increased.

Figure 14:
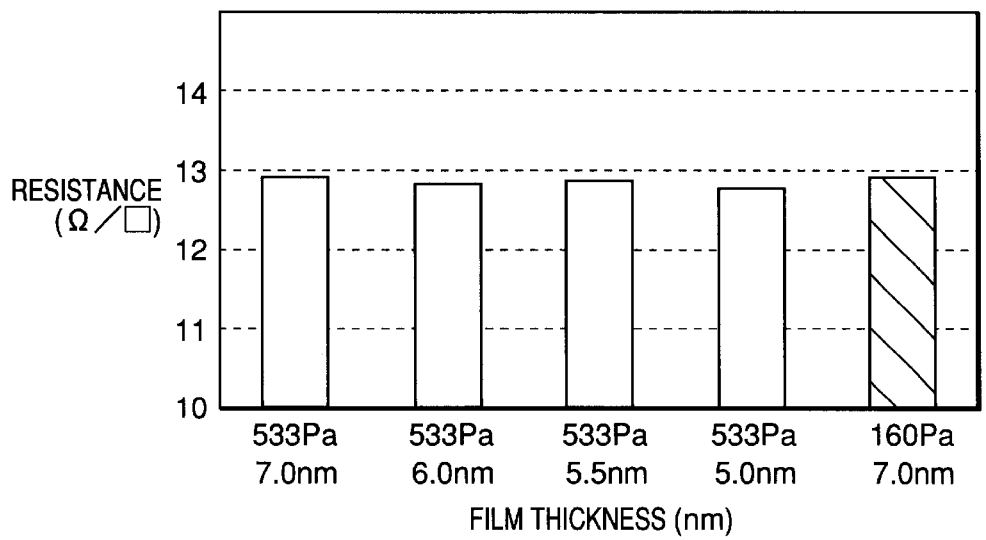
FIG. 14 is a schematic representation illustrating experiment results.

Wire resistances ($\Omega/\square$) of the lower electrodes in the five different specimen devices manufactured in the second embodiment are measured, the measurement results being shown in FIG. 14. All the five specimen devices exhibit values of about 12.9 $\Omega/\square$. This means that increasing the degree of vacuum in the deposition chamber for the ISN treatment does not affect the lower electrodes.

Further, under the same conditions, a hold time test is conducted on the five specimen devices manufactured in the second embodiment. Acceptance rates of the devices are computed, the results being shown in FIG. 15.

Figure 15:
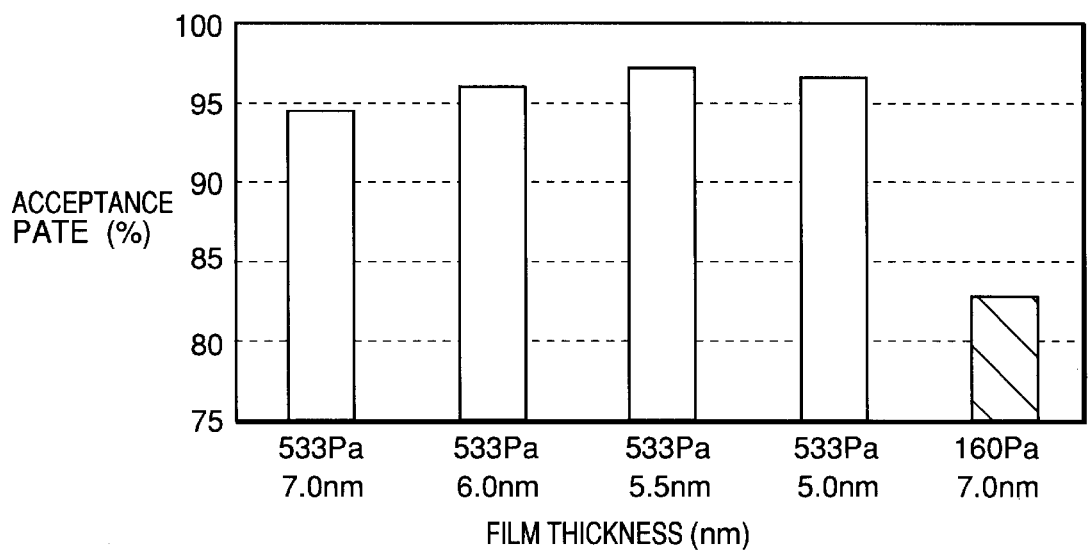
FIG. 15 is a schematic representation illustrating experiment results.

As can be seen from FIG. 15, when the degree of vacuum in the deposition chamber is set to 533 Pa for the ISN treatment, and the thickness of the silicon nitride film 25b is set to 5.0 nm, 5.5 nm, 6.0 nm, and 7.0 nm, respectively, the acceptance rates in the hold time test of all the specimen devices are around 95%. In contrast, when the degree of vacuum in the deposition chamber for the ISN treatment is set to 160 Pa, and the thickness of the silicon nitride film 25b is set to 7.0 nm, as a comparative example, the acceptance rate in the hold time test is around 83%, which is about 12% lower than that of the embodiment. Therefore, the manufacturing method for a semiconductor device in accordance with the present invention also provides an advantage of reducing hold time defects.

In the manufacturing method for a semiconductor device in accordance with the present invention, the degree of vacuum in the deposition chamber at the time of the ISN treatment is set higher than that in the conventional method (160 Pa). Hence, more ammonia gas is contained in the ISN treatment atmosphere as compared with the conventional method, so that the volume of hydrogen generated when the ammonia gas is decomposed is likely to increase accordingly. Thus, an annealing effect by the hydrogen can be expected to work on the specimens.

Moreover, since the film thickness of a portion of the silicon nitride film that is formed on the interlayer dielectric can be increased, making it possible to control a phenomenon of out diffusion wherein impurities contained in the interlayer dielectric diffuse out.

3. Third Embodiment (Experiments on ISN treatment time)

The following will describe a relationship between an ISN treatment time and the thickness of a silicon nitride film formed on an interlayer dielectric.

Four specimen devices are prepared according to the procedure described in the above embodiments under four different conditions or ISN treatment times, namely, 30 minutes, 60 minutes, 90 minutes, and 120 minutes, respectively, the degree of vacuum in the deposition chamber for the ISN treatment being set at 160 Pa. The time spent for the CVD following the ISN treatment is set to a time required for a 5.5-nm silicon nitride film to be grown on a test silicon wafer placed in the deposition chamber.

The film thicknesses of the silicon nitride films 25b on the interlayer dielectrics in the four specimen devices produced under the conditions described above are measured. The measurement results are shown in FIG. 16.

Figure 16:
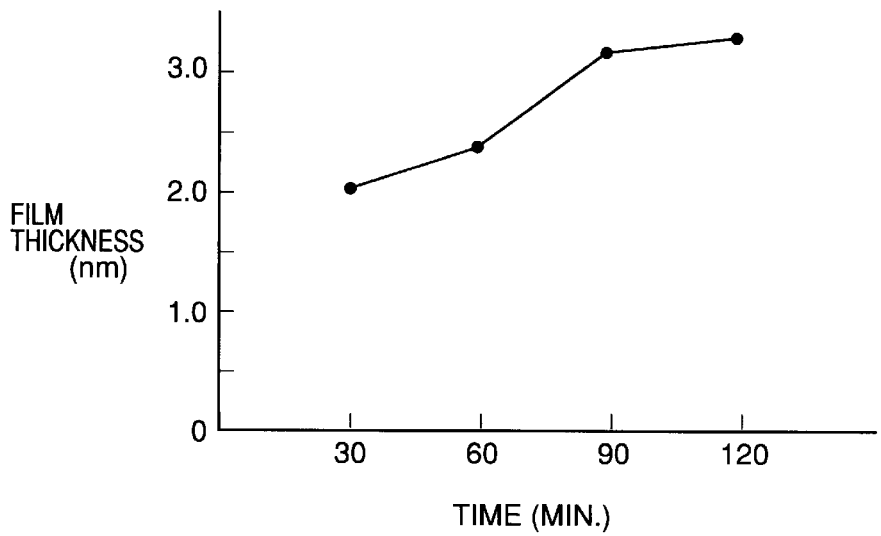
FIG. 16 is a schematic representation illustrating experiment results.

As can be understood from FIG. 16, when the ISN treatment time exceeds 90 minutes, the film thickness of the silicon nitride film formed on the interlayer dielectric is about 3.0 nm regardless of the value of the ISN treatment time. Furthermore, it is possible to form silicon nitride films that are thicker than those produced when the ISN treatment time is shorter than 90 minutes. Hence, when silicon nitride films are formed using the ISN treatment time as a parameter, it is meaningful, for forming a thicker silicon nitride film on the interlayer dielectric, to check beforehand a pretreatment time required for the film thickness of a portion of the silicon nitride film formed on the interlayer dielectric to reach saturation, and to set a time longer than the saturation time (90 minutes in the example shown in FIG. 16) as the ISN treatment time.

The healing oxide films of two (30-minute and 90-minute ISN treatment times) out of the four specimen devices will now be discussed. More specifically, regarding these two specimen devices, the thicknesses of the healing oxide films produced in the silicon nitride film portions on the lower electrodes after the silicon nitride films have been subjected to healing oxidization are measured.

Figure 17:
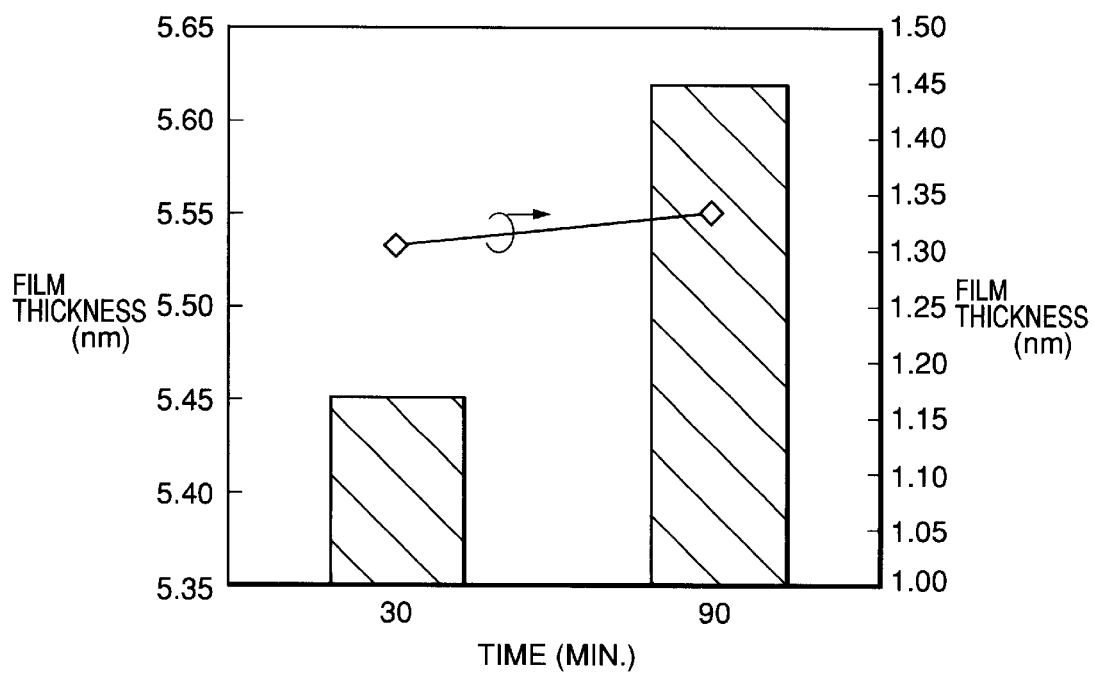
FIG. 17 is a schematic representation illustrating experiment results.
Figure 18:
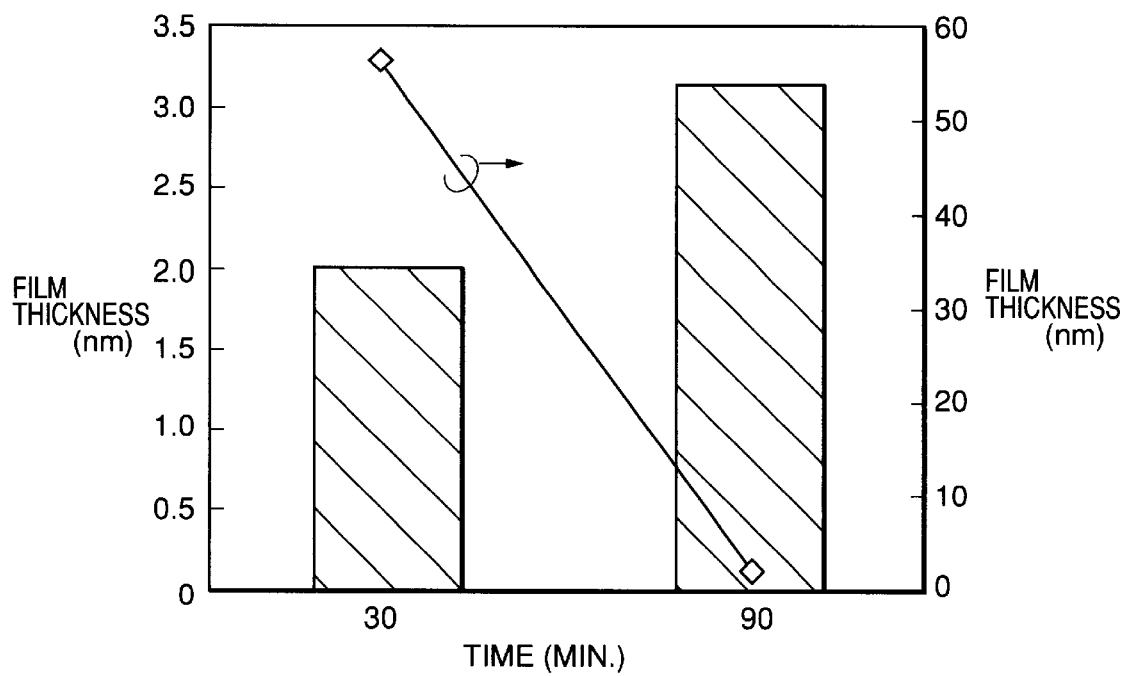
FIG. 18 is a schematic representation illustrating experiment results.

The measurement results are shown in FIG. 17 and FIG. 18. Wherein the thicknesses of silicon nitride films are also shown. FIG. 17 provides data regarding the thicknesses of silicon nitride films on the lower electrodes and the thicknesses of healing oxide films, while FIG. 18 provides data regarding the thicknesses of silicon nitride films on the interlayer dielectrics and the thicknesses of healing oxide films. In both charts, the axis of abscissa indicates the ISN treatment time, the left axis of ordinates indicates the thickness of the silicon nitride film, and the right axis of ordinates indicates the thickness of the healing oxide film. The bar graphs provide data regarding the film thicknesses of the silicon nitride films, and the line charts provide data regarding the film thicknesses of the healing oxide films.

As can be seen from FIG. 17, the values of the thicknesses of the healing oxide films on the lower electrodes are nearly the same irrespective of the ISN treatment time. However, on the interlayer dielectric, as can be understood from the FIG. 18, the thickness of the healing oxide film produced when the ISN treatment time is 30 minutes is 56 nm, while the thickness is approximately 1.0 nm, which is only $\frac{1}{56}$ of the former, meaning improved resistance to oxidization, when the ISN treatment time is 90 minutes.

Thus, it has been found that, in order to also improve the resistance of the silicon nitride films to oxidization, the ISN treatment time should be set to a predetermined time (90 minutes in the example of FIG. 16) or longer.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the invention.

For instance, a semiconductor device to which the manufacturing method of the present invention is applicable is by no means limited to the device discussed in conjunction with FIG. 1. The manufacturing method of the invention can be extensively applied to the manufacture of semiconductor devices provided with capacitors on interlayer dielectrics, the capacitors employing silicon nitride films as capacitor dielectric films.

Furthermore, in the above descriptions, $SiH_2Cl_2$ has been used, together with the ammonia gas, as the gas for forming a silicon type thin film. The gas for forming the silicon type thin film, however, is not limited thereto; other suitable gases may be used instead.

In addition, in the above descriptions of the examples, the reduced pressure, hot wall type CVD apparatus has been used as the apparatus for implementing the ISN treatment and the apparatus for forming the silicon nitride films. The apparatus, however, is not limited thereto, and a nitriding furnace having the same structure as that of a high-pressure oxidizing furnace or a cold wall type rapid thermal processing (RTP) apparatus or rapid thermal nitride apparatus may be used to obtain the same advantages as those effected by the foregoing embodiments.

As is obvious from the above descriptions, in order to fabricate a semiconductor device provided with a capacitor on an interlayer dielectric, the capacitor having a silicon nitride film as a capacitor dielectric film, the manufacturing method for a semiconductor device in accordance with the present invention includes the steps of: forming a lower electrode composed of a silicon type material on an interlayer dielectric, placing a specimen on which the lower electrode has been formed in a deposition chamber to perform pretreatment in which heat is applied to the specimen in the deposition chamber wherein pressure has been reduced an ammonia gas atmosphere has been set, then introducing an ammonia gas and a gas for forming a silicon type thin film into the deposition chamber to form a silicon nitride film on the lower electrode and the interlayer dielectric, wherein a degree of vacuum in the deposition chamber at the time of the pretreatment is set to 533 Pa or more, and a time for the pretreatment is set to be longer than the aforesaid saturation time.

Hence, the a portion of the silicon nitride film that is formed on the interlayer dielectric can be made thicker, so that the oxidization resistance of the silicon nitride film on the interlayer dielectric is improved. This makes it possible to prevent abnormal oxidization of wires under interlayer dielectrics at the time of healing oxidization after silicon nitride films are formed.

What is claimed is:

1. A method of manufacturing a semiconductor device that includes a capacitor electrode and a silicon nitride film as a capacitor dielectric film, said method comprising:

forming a lower electrode on an interlayer dielectric;

treating the lower electrode in an ammonia gas atmosphere in a deposition chamber for a given period of time after a pressure within the chamber has been reduced to a given pressure so as to cause the lower electrode to be reduced and thermally nitrided; and forming a silicon nitride film on said lower electrode and said interlayer dielectric after the lower electrode has been reduced and thermally nitrided;

wherein the given period of time is longer than a period of time which elapses from a start of nitriding of said silicon nitride film to a nitride saturation of said silicon nitride film.

2. The method according to claim 1, wherein said treating of the lower electrode further comprises increasing a temperature within the deposition chamber to a given temperature for the given period of time.

3. The method according to claim 1, wherein said lower electrode is formed of a silicon type material.

4. The method according to claim 3, wherein the silicon type material composing said lower electrode is polycrystalline silicon.

5. The method according to claim 1, wherein an ammonia gas and a gas for forming a silicon type thin film are used for forming said silicon nitride film.

6. The method according to claim 5, wherein dichlorosilane ($SiH_2Cl_2$) is used as said gas for forming a silicon type thin film.

7. A method of manufacturing a semiconductor device that includes a capacitor electrode and a silicon nitride film as a capacitor dielectric film, said method comprising:

forming a lower electrode on an interlayer dielectric;

treating the lower electrode in an ammonia gas atmosphere in a deposition chamber for a given period of time after a pressure within the chamber has been reduced to a pressure range from 533 Pa to 1333 Pa so as to cause the lower electrode to be reduced and thermally nitrided; and forming a silicon nitride film on said lower electrode and said interlayer dielectric after the lower electrode has been reduced and thermally nitrided;

wherein the given period of time is longer than a period of time which elapses from a start of nitriding of said silicon nitride film to a nitride saturation of said silicon nitride film.

8. The method according to claim 7, wherein said treating of the lower electrode further comprises increasing a temperature within the deposition chamber to a given temperature for the given period of time.

9. The method according to claim 7, wherein said lower electrode is formed of a silicon type material.

10. The method according to claim 9, wherein the silicon type material composing said lower electrode is polycrystalline silicon.

11. The method according to claim 7, wherein an ammonia gas and a gas for forming a silicon type thin film are used for forming said silicon nitride film.

12. The method according to claim 11, wherein dichlorosilane ($SiH_2Cl_2$) is used as said gas for forming a silicon type thin film.

* * * * *